United States Patent [19]

Jun

[11] Patent Number: 5,641,383

[45] Date of Patent: Jun. 24, 1997

[54] SELECTIVE ETCHING PROCESS

[75] Inventor: Young Kwon Jun, Seoul, Rep. of Korea

[73] Assignee: LG Semicon Co., Ltd., Chungcheongbuk-do, Rep. of Korea

[21] Appl. No.: 190,666

[22] Filed: Feb. 2, 1994

[30] Foreign Application Priority Data

Jan. 12, 1994 [KR] Rep. of Korea .................... 1994 427

[51] Int. Cl.$^6$ ................................................. H01L 21/762
[52] U.S. Cl. ............................................ 438/695; 438/439
[58] Field of Search ........................ 156/643.1, 646.1, 156/662.1, 653.1; 437/225

[56] References Cited

U.S. PATENT DOCUMENTS

| | | | |
|---|---|---|---|
| 3,715,249 | 2/1973 | Panousis et al. | 156/17 |
| 4,749,640 | 6/1988 | Tremont et al. | 430/314 |
| 4,829,025 | 5/1989 | Iranmanesh | 437/228 |
| 4,971,654 | 11/1990 | Schnegg et al. | 156/638 |

FOREIGN PATENT DOCUMENTS 2203592  10/1988  United Kingdom .

OTHER PUBLICATIONS

Wolf, Stanley, Ph.D., *Silicon Processing for the VLSI ERA*, vol. 2: *Process Integration* (Lattice Press, 1990), p. 27.
"Etching Rates of Silicon Dioxide, and Silicon Nitride ($Si_3N_4$) Insulating Films in Ammonia–Hydrogen Peroxide Cleaning Process"; 1983'; Watanabe et. al.; Proc. Electrochemical Soc., 83–8 (Proc. Symp. Silicon Nitride Thin Insul. Films); abstract only.

*Primary Examiner*—R. Bruce Breneman
*Assistant Examiner*—George Goudreau
*Attorney, Agent, or Firm*—Morgan, Lewis and Bockius LLP

[57] ABSTRACT

According to the selective etching process, when two different material layers, e.g. a first material layer (a silicon nitride film) and a second material layer (a silicon film) are coexistent, the etch selectivity of the second material layer with regard to the wet etch for the first material layer, an object of etch, can be improved by transforming the entire or partial surface of the second material layer with a third material (an oxidizing agent) having high selectivity for the first material layer prior to or during the wet etch. As a result, the second material layer can be prevented from being damaged.

In addition, when the inventive process is applied to the LOCOS process, it is preventive of the substrate damage caused by the destruction of the pad oxide film resulting from so-called white ribbon phenomenon.

5 Claims, 3 Drawing Sheets

SELECTIVE ETCHING PROCESS

BACKGROUND OF THE INVENTION

The present invention relates, in general, to a selective etching process in semiconductor fabrication processes and, more particularly, to a process for etching a silicon nitride film selectively with regard to a silicon film.

Generally, a silicon nitride film is used as an oxidation mask layer when carrying out a local oxidation of silicon (hereinafter, "LOCOS") process, which is widely utilized in semiconductor device fabrication.

For better understanding of the background of the present invention, the conventional LOCOS process will be explained along with its problems. With reference to FIG. 1, there is illustrated the conventional LOCOS process. As illustrated in this figure, the conventional LOCOS process comprises the steps of annealing a silicon substrate 1 at about 950° C. under an oxidative ambient such as $O_2$ to form a pad oxide film 2 thereon in a thickness of 200 to 300 Å, depositing a silicon nitride film 3 having a thickness of 1,400 to 2,500 Å on the pad oxide film 2 at temperatures ranging from 750° to 800° C. under a mixture gas of $NH_3$ and $SiH_4$ or a mixture gas of $NH_3$ and $SiH_4$ by low pressure chemical vapor deposition (hereinafter "LPCVD"), applying anisotropic dry etch to the silicon nitride film 3 under an etching gas containing $CHF_3$ or $CF_4$ with a predetermined photosensitive film pattern as a mask, so as to expose a predetermined portion, that is, a device separating region of the substrate, and removing the photosensitive pattern and oxidizing the exposed portion at about 1,000° C. for 100 to 200 minutes under a mixture gas of $O_2$ and $H_2$, so as to form a field oxide film 4 in a thickness of 4,000 to 7,000 Å.

After the formation of the field oxide film 4, the silicon nitride film 3 used as a mask layer is removed, and the pad oxide film 2 functions as an etch stopper. To remove the silicon nitride film 3, there has been generally performed a wet etch process using a refluxed boiling phosphoric acid ($H_3PO_4$) solution, which shows high etch selectivity. For example, in case of etching the silicon nitride film 3 with the pad oxide film 2 as an etch stopper, the phosphoric acid solution with 91.5% concentration etches the silicon nitride film 3 in an etch speed of 105 Å/min at 180° C. On the other hand, the solution etches the pad oxide film 2 in about 0 Å/min. That is, the etch stopper is very resistant to the etching solution.

However, while such general LOCOS process is carried out, there occurs the formation of a thin silicon nitride film at the interface between the pad oxide film 2 and the silicon substrate 1, which is the so-called white ribbon phenomenon and was found by Kooi et al. This phenomenon is due to the fact that ammonia gas resulting from the reaction of moisture ($H_2O$) with the silicon nitride ($Si_3N_4$) film mask layer 3 diffuses into the surface of the silicon substrate 1 through the pad oxide film 2 and reacts with the silicon substrate 1, so as to form a spot of silicon nitride film.

As shown in FIG. 1, the pad oxide film 2 is locally thinner because of the formation of the nitride film spot K. Even though the pad oxide film 2 resists being etched, it is much more slowly etched when the silicon nitride film 3 is removed. Hence, the silicon substrate 1 is apt to be exposed through the thinner portion of the pad oxide film 2 and is locally damaged by the etching solution for the silicon nitride film. Such phenomenon will be more frequently generated since, as the degree of device integration is increased, the pad oxide film 2 is thinner.

On the other hand, the silicon nitride film may be removed in a wet etch manner, using a polysilicon-buffered LOCOS (hereinafter "PBL") process making use of a polysilicon layer intercalated between the silicon oxide film and the silicon nitride film. During the removal of the silicon nitride film with the PBL process, the etching solution penetrates into and damages the polysilicon layer.

For example, if the concentration of a nitric acid solution, an etching solution, is 95%, the etch speed for the silicon nitride film is 55 Å/min at 165° C., whereas for the polysilicon layer, it is 13 Å/min at the same temperature. The difference between the two etch speeds is not so large. Accordingly, to prevent the damage of the polysilicon layer, additional etch treatment is required, leading to the complication of semiconductor fabrication processes.

SUMMARY OF THE INVENTION

Therefore, an object of the present invention is to solve the above problems encountered in the prior arts and to provide a selective etching process, improved in the selectivity for a material to be etched which is coexistent with the other materials.

In accordance with an aspect of the present invention, the above object can be accomplished by providing a selective etching process, comprising the steps of: coating a predetermined portion of a first material layer formed on a substrate with a second material; and applying an etching solution containing a third material to said first material layer and said second material layer, to transform the exposed surface of said first material layer with said third material into a fourth material layer having higher selectivity than said second material layer and to simultaneously etch said second material layer.

In accordance with another aspect of the present invention, there is provided a selective etching process comprising the steps of: forming a protective film on a first material layer overlaying a substrate: forming a second material layer on said protective film; and removing said second material layer by use of wet etch.

In accordance with further an aspect of the present invention, there is provided a selective etching process comprising the steps of: forming a second material layer on the predetermined portions of a first material layer overlaying a substrate, so as to selectively expose said first material layer; forming a protective film having higher etch selectivity than said second material layer on the exposed surface of said first material layer; and removing said second material by use of wet etch.

BRIEF DESCRIPTION OF THE DRAWINGS

Other objects and aspects of the invention will become apparent from the following description of embodiments with reference to the accompanying drawings in which.

DETAILED DESCRIPTION OF THE PREFERRED EMBODIMENTS

Figure 1:
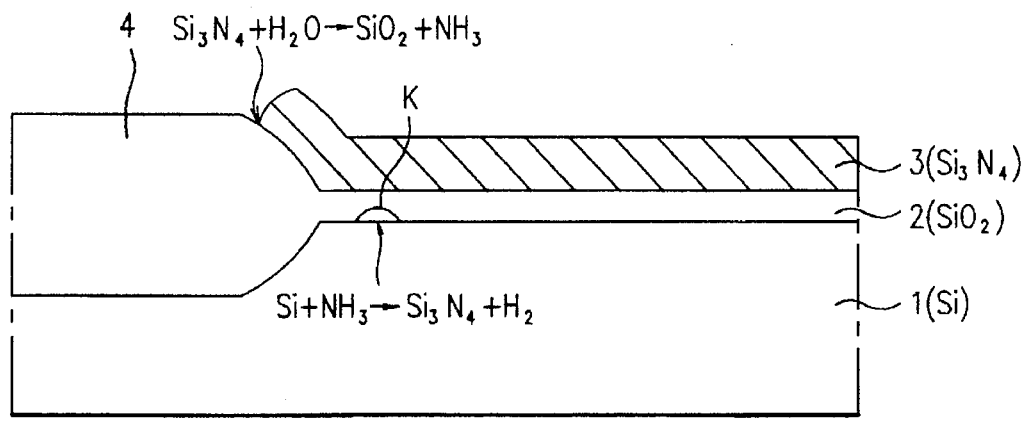
FIG. 1 is a schematic, cross-sectional view showing a white ribbon phenomenon generated in LOCOS process.

According to the present invention, the etch selectivity of for a silicon film, especially for an amorphous silicon film or a polysilicon film can be improved when a silicon nitride film is subjected to a wet etch process using a phosphoric acid solution. During or prior to etching the silicon nitride film, a thin silicon oxide film is formed on the surface of the silicon film adjacent to a nitride film or its pattern, in accordance with the present invention. In other words, the silicon oxide film functions as a protective film for the silicon film in virtue of the lower reactivity thereof with the phosphoric acid solution than the silicon nitride film.

It is known that when the wet etch for the silicon nitride film is carried out by use of a phosphoric acid solution, phosphoric acid and water hydrolyze the silicon nitride film into hydrous silica and ammonia and ammonium phosphate is formed in the solution. Since Si—O—Si bond is stronger and thus is not more easily hydrolyzed than Si—N bond, an oxide film is more stable than a nitride film.

As an etching solution, a phosphoric acid solution is used in the present invention. Preferred is a solution which has boiling points ranging from approximately 140° to approximately 200° C. and wherein phosphoric acid amounts to approximately 78 to 98% by weight.

Hereinafter, the preferred embodiments of the present invention will be, in detail, described with reference to the accompanying drawings, wherein like reference numerals designate like parts, respectively.

Figure 2A:
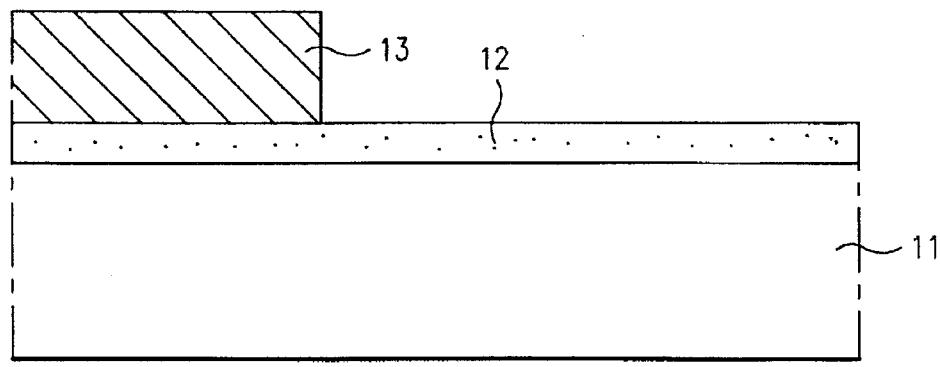
FIGS. 2A and 2B are schematic, cross-sectional views illustrating a selective etching process according to a first embodiment of the present invention.
Figure 2B:
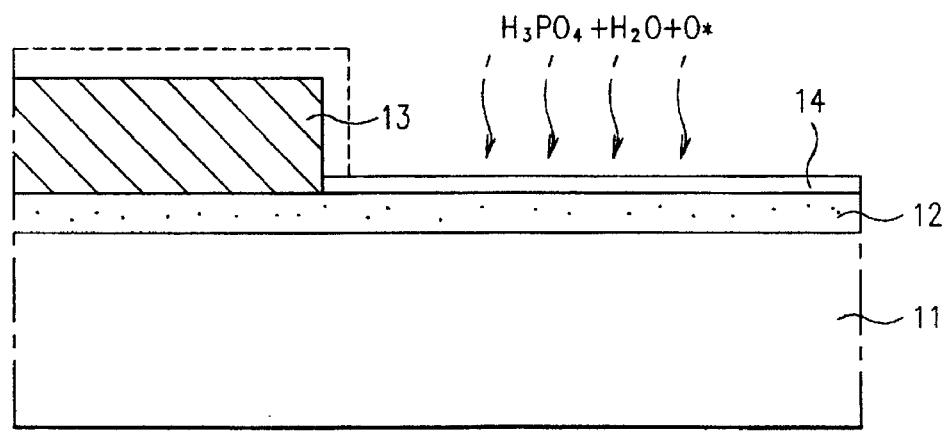

Referring initially to FIGS. 2A and 2B, there is illustrated a selective etching process according to a first embodiment of the present invention.

On a substrate 11, as shown in FIG. 2A, there are laminated a silicon film (an amorphous silicon film or a polysilicon film) 12 and a nitride film, in due order. The nitride film is selectively removed by use of a dry etch process, leaving a nitride film pattern 13 on a predetermined portion of the silicon film 12. As a result, the silicon film 12 is partially exposed and partially covered by the nitride pattern 13. Dry etch process used to form the nitride film pattern has little influence on the silicon film 12.

To etch the nitride film pattern 13, there is used a preferred etching solution consisting of a phosphoric acid ($H_3PO_4$) solution and an oxidizing agent such as hydrogen peroxide ($H_2O_2$) wherein the oxidizing agent amounts to not less than 10% by weight of the etching solution, as shown in FIG. 2B.

When the phosphoric acid solution is mixed with the oxidizing agent such as hydrogen peroxide, a hydrogen peroxide molecule is decomposed into a water molecule and an oxygen radical, which causes the exposed surface of the silicon film 12 to be oxidized. In other words, the etching solution according to the present invention protects the exposed silicon film 12 while it etches the nitride film pattern 13. In detail, the phosphoric acid solution contained in the etching solution according to the present invention plays a role in etching the nitride film pattern 13 in a wet etch manner, whereas the oxidizing agent, such as hydrogen peroxide, generates oxygen radicals that react with silicon (Si) of the exposed silicon film 12 so as to form an oxide film 14 on the silicon film 12 at same time, as shown in the following reaction formula:

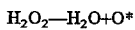
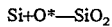

As stated above, the oxide film 14 formed on the silicon film 12 according to the first embodiment of the present invention functions as a protective film for the silicon film 12 to the etching solution. Consequently, the etch selectivity of the silicon film 12 with regard to the wet etch for the nitride film pattern 13 is enhanced, so that the silicon film is prevented from being damaged.

Figure 3A:
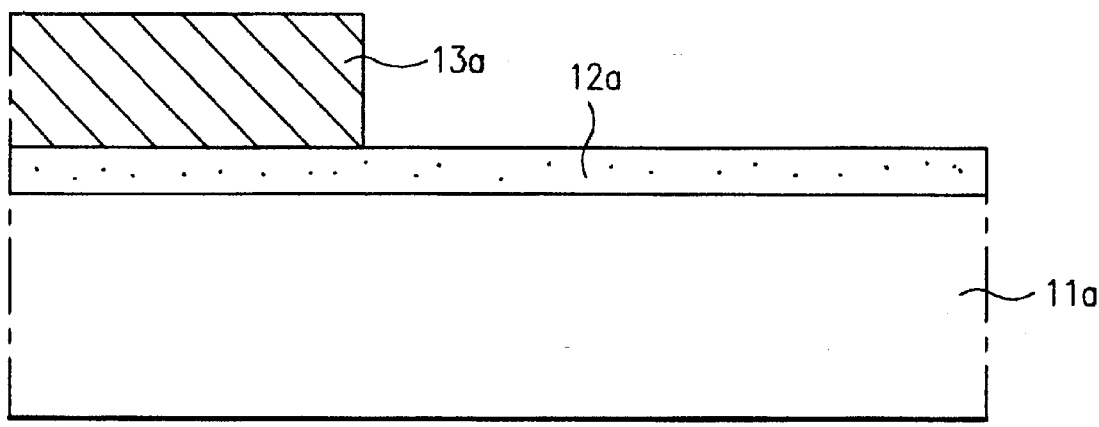
FIGS. 3A and 3B are schematic, cross-sectional views illustrating a selective etching process according to a second embodiment of the present invention.
Figure 3B:
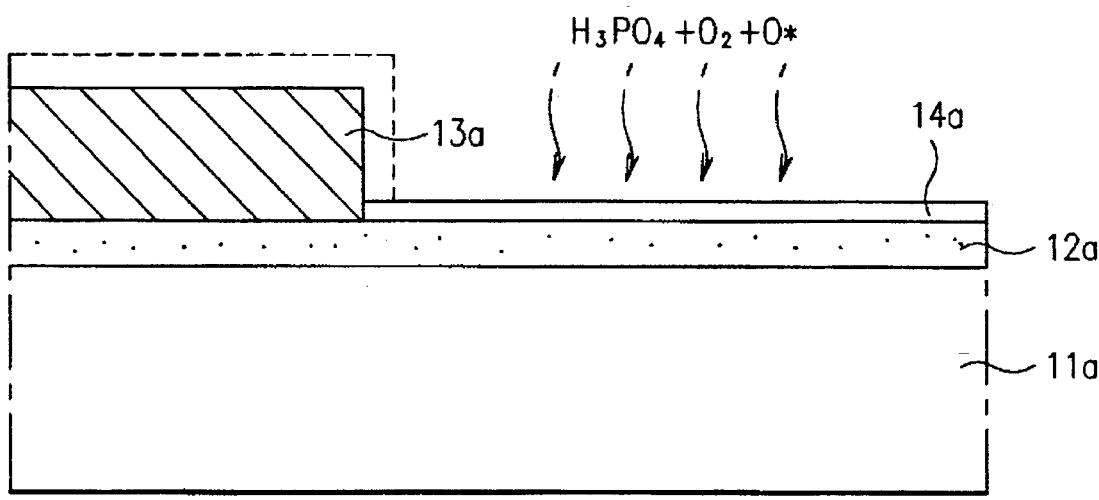

Referring now to FIGS. 3A and 3A, there is illustrated a selective etching process according to a second embodiment of the present invention.

FIG. 3A shows the step previous to carrying out selectively removing the nitride film in a wet etch manner. As shown in FIG. 3A, a nitride film pattern 13a is formed on a predetermined portion of a silicon film 12a covering a substrate 11. As a result, the silicon film 12a is partially exposed and partially covered by the nitride pattern 13a.

FIG. 3A illustrates the step for selectively etching the nitride film pattern 13a with regard to the silicon film 12a. To selectively etch the nitride film pattern 13a according to the second embodiment of the present invention, there is used a preferred etching solution of a phosphoric acid solution injected with an oxidative gas such as ozone ($O_3$).

To dissolve ozone in the phosphoric acid solution, an ozone gas formed by electrolyzing pure water is led to pass through a membrane. The concentration of ozone in the etching solution is preferably on the order of not less than 1 ppm.

Dissolved ozone is self-decomposed to generate oxygen radicals, which then react with silicon (Si) of the silicon film 12 to form an oxide film 14a on the surface of the exposed silicon film 12a, as shown in the following reaction formulas:

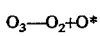
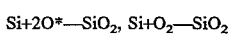

On carrying out wet etch for the nitride film pattern 13a, the oxide film 14a formed on the exposed silicon film 12a not only functions as a protective film for the silicon film 12, but improves the selectivity of the silicon film 12a with regard to the nitride film pattern 13a.

A third embodiment of the present invention is to be explained with reference to FIG. 4. The third embodiment is for the case that an un-patterned nitride film is formed on a silicon film. That is, it is to remove the nitride film in a wet etch manner when the silicon film is not selectively exposed but entirely covered with the nitride film.

Figure 4:
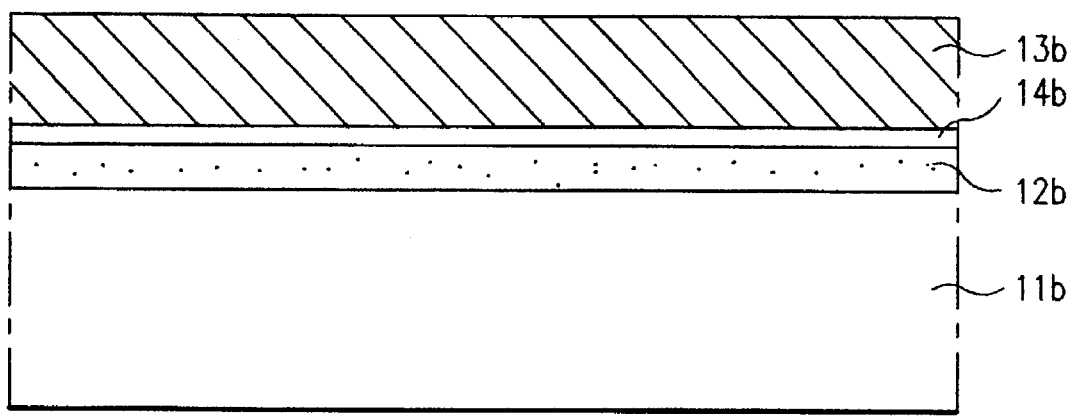
FIG. 4 is a schematic, cross-sectional view illustrating a selective etching process according to a third embodiment of the present invention.

As shown in FIG. 4, a silicon film 12b overlaying a substrate 11b is exposed to an oxidative ambient or an oxidative solution to form a thin oxide film 14b as a protective film therefor, in advance of the formation of a nitride film 13b. Then, the nitride film 13b is deposited on the oxide film 14b, and the resulting structure may be subjected to desired processes. Thereafter, when the nitride film 13b is etched with an etching solution, the oxide film 14b functions as a protective layer, preventing the damage of the silicon film 12b.

Figure 5:
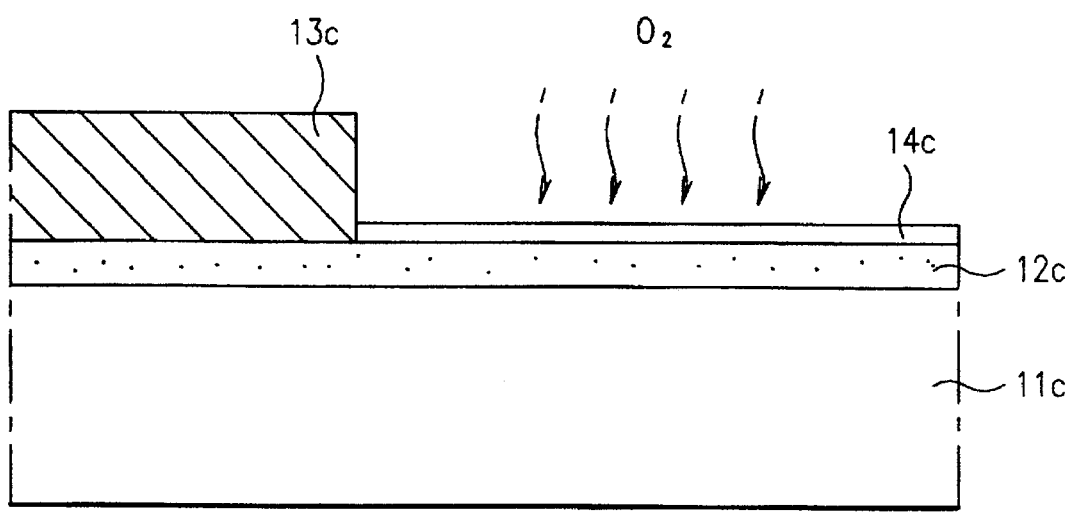
FIG. 5 is a schematic, cross-sectional view illustrating a selective etching process according to a fifth embodiment of the present invention.

Turning now to FIG. 5, there is illustrated a selective etching process according to a fourth embodiment of the present invention. The fourth embodiment is for the case that a nitride film formed on a silicon film 12c atop a substrate 11c is already patterned, exposing the silicon film 12c partially.

In this embodiment, the exposed silicon film 12c comes into contact with an oxidative ambient or an oxidizing solution to form an oxide film 14c on the exposed surface of the silicon film 12c in advance of etching the nitride film pattern 13c. Thereafter, when the nitride film pattern 13c is subjected to a wet etch process, the silicon film 12 is prevented from being damaged by virtue of the protection provide by the oxide film 14c.

According to the present invention, as described hereinbefore, when two different material layers, e.g. a first material layer (for example, a silicon nitride film) and a second material layer (for example, a silicon film) are coexistent, the etch selectivity of the second material layer with regard to the wet etch for the first material layer, an object of etch, can be improved by transforming the entire or partial surface of the second material layer with a third material (for example, an oxidizing agent) having high selectivity for the first material layer prior to or during the wet etch. As a result, the second material layer can be prevented from being damaged.

In addition, when the inventive process is applied to the LOCOS process, it is preventive of the substrate damage caused by the destruction of the pad oxide film resulting from so-called white ribbon phenomenon.

Although the preferred embodiment of the present invention has been disclosed for illustrative purposes, those skilled in the art will appreciate that various modifications, additions and substitutions are possible, without departing from the scope and spirit of the present invention as disclosed in the accompanying claims.

What is claimed is:

1. A selective etching process, comprising the steps of:
    providing a first material layer formed on a substrate;
    coating a portion of said first material layer with a second material layer; and
    applying an etching solution in combination with an oxidative gas to said first material layer and said second material layer to transform the exposed surface of said first material layer into a third material by reaction with said oxidative gas, said third material having a lower reactivity with said etching solution than said second material layer, and to etch said second material layer, said transformation into said third material and said etching of said second material layer occurring simultaneously.

2. The selective etching process according to claim 1, wherein said oxidative gas comprises an ozone gas.

3. The selective etching process according to claim 1, wherein said etching solution comprises a phosphoric acid solution.

4. The selective etching process according to claim 1, wherein said first material layer comprises a silicon film and said second material layer comprises a silicon nitride film.

5. The selective etching process according to claim 1, wherein said third material comprises an oxide film.

* * * * *